(12) United States Patent
Tossoun et al.

(10) Patent No.: US 10,935,721 B2
(45) Date of Patent: Mar. 2, 2021

(54) INTEGRATED PHOTODIODE WITH UNIQUE WAVEGUIDE DRIFT LAYER

(71) Applicant: University of Virginia Patent Foundation, Charlottesville, VA (US)

(72) Inventors: Bassem Tossoun, Charlottesville, VA (US); Andreas Beling, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 16/604,219

(22) PCT Filed: Apr. 18, 2018

(86) PCT No.: PCT/US2018/028119
§ 371 (c)(1),
(2) Date: Oct. 10, 2019

(87) PCT Pub. No.: WO2018/195168
PCT Pub. Date: Oct. 25, 2018

(65) Prior Publication Data
US 2020/0116929 A1    Apr. 16, 2020

Related U.S. Application Data

(60) Provisional application No. 62/658,733, filed on Apr. 17, 2018, provisional application No. 62/488,099, filed on Apr. 21, 2017.

(51) Int. Cl.
*G02B 6/12* (2006.01)
*H01L 31/0232* (2014.01)
(Continued)

(52) U.S. Cl.
CPC .... *G02B 6/12004* (2013.01); *H01L 31/02327* (2013.01); *H01L 31/03046* (2013.01);
(Continued)

(58) Field of Classification Search
CPC .. G02B 2006/12123; G02B 6/00; G02B 6/42; G02B 6/12004; H01L 27/00;
(Continued)

(56) References Cited

U.S. PATENT DOCUMENTS 4,835,575 A    5/1989  Plihal
5,263,111 A   11/1993  Nurse et al.
(Continued)

FOREIGN PATENT DOCUMENTS

WO    WO 2016/106731    7/2016

OTHER PUBLICATIONS

Atzori et al., "The Internet of Things: A survey", Computer Networks, 2010, pp. 2787-2805, vol. 54.
(Continued)

*Primary Examiner* — Thomas A Hollweg
*Assistant Examiner* — Mary A El-Shammaa
(74) *Attorney, Agent, or Firm* — Robert J. Decker

(57) ABSTRACT

A monolithic waveguide-integrated photodiode having a first electroconductive contact layer, a depleted waveguide core layer, an absorption layer, and a second electroconductive contact layer, the refractive index of the first electroconductive contact layer being less than the depleted waveguide core layer, the refractive index of the waveguide core layer being less than the absorption layer, and the refractive index of the second electroconductive contact layer being less than the absorption layer. The waveguide core layer is arranged between the first electroconductive contact layer and the absorption layer and also acts as a depleted carrier drift layer. This arrangement results in greater quantum efficiency and shorter photodiode lengths for a given bandwidth.

32 Claims, 4 Drawing Sheets

(51) Int. Cl.
  *H01L 31/0304* (2006.01)
  *H01L 31/0352* (2006.01)
(52) U.S. Cl.
  CPC ......... *H01L 31/035281* (2013.01); *G02B 2006/12123* (2013.01)
(58) Field of Classification Search
  CPC ......... H01L 27/1446; H01L 31/02; H01L 31/02327; H01L 31/03046; H01L 31/035281
  See application file for complete search history.

(56) References Cited

U.S. PATENT DOCUMENTS

| | | | |
|---|---|---|---|
| 5,285,514 | A | 2/1994 | Nojiri et al. |
| 5,391,869 | A * | 2/1995 | Ade .......... G02B 6/42 250/227.24 |
| 5,991,487 | A | 11/1999 | Sugiyama |
| 6,177,710 | B1 | 1/2001 | Nishikata et al. |
| 7,095,938 | B2 | 8/2006 | Tolstikhin |
| 7,120,350 | B2 | 10/2006 | Block |
| 7,355,259 | B2 | 4/2008 | Yamaguchi et al. |
| 7,515,793 | B2 | 4/2009 | Dehlinger |
| 7,868,406 | B2 | 1/2011 | Bach et al. |
| 8,861,909 | B2 | 10/2014 | Lipson |
| 9,705,282 | B2 * | 7/2017 | Takabayashi ......... H01S 5/0612 |
| 10,134,937 | B2 * | 11/2018 | Runge ......... G02B 6/12004 |
| 10,374,107 | B2 * | 8/2019 | Nada ......... H01L 31/02327 |
| 2004/0096175 | A1 | 5/2004 | Tolstikhin |
| 2005/0285123 | A1 | 12/2005 | Yamaguchi |
| 2009/0057796 | A1 | 3/2009 | Bach |
| 2010/0327382 | A1 | 12/2010 | Campbell |
| 2013/0113063 | A1 | 5/2013 | Campbell |
| 2016/0336718 | A1 * | 11/2016 | Takabayashi ......... H01S 5/1096 |

OTHER PUBLICATIONS

Cinguino et al., "Monolithic integrated InGaAlAs/InP ridge waveguide photodiodes for 1.55 t-tm operation grown by molecular beam epitaxy", Applied Physics Letters, May 25, 1987, pp. 1515-1517, vol. 50, No. 21.

Deri et al., "Efficient vertical coupling of photodiodes to InGaAsP rib waveguides", Applied Physics Letters, Jun. 17, 1991, pp. 2749-2751, vol. 58, No. 24.

Deri et al., "Integrated waveguide/photodiodes using vertical impedance matching", Applied Physics Letters, Apr. 30, 1990, pp. 1737-1739, vol. 56, No. 16.

Kato et al., "A High-Efficiency 50 GHz InGaAs Multimode Wave guide Photodetector", IEEE Journal of Quantum Electronics, Dec. 1992, pp. 2728-2735, vol. 28, No. 12.

Klamkin et al., "Uni-traveling-carrier variable confinement waveguide photodiodes", Optics Express, May 23, 2011, pp. 10199-10205, vol. 19, No. 11.

Ravindra et al., "Energy gap—refractive index relations in semiconductors—An overview", Infrared Physics & Technology, 2007, pp. 21-29, vol. 50.

Shen et al., "High-bandwidth uni-traveling carrier waveguide photodetector on an InP-membrane-on-silicon platform", Optics Express 8290, Apr. 8, 2016, pp. 8290-8301, vol. 24, No. 8.

Tossoun et al., "High Speed InP-based Type-II Multiple Quantum Well Integrated Waveguide Photodiode at 2.0-μm Wavelength", Advanced Photonics 2018 (BGPP, IPR, NP, NOMA, Sensors, Networks, SPPCom, SOF), OSA Technical Digest (online), Optical Society of America, 2018, 2 pages, paper IW1B.3.

Tossoun et al., "High-Speed InP-Based p-i-n. Photodiodes With InGaAs/GaAsSb Type-II Quantum Wells", IEEE Photonics Technology Letters, Feb. 15, 2018, pp. 399-402, vol. 30, No. 4.

Ye et al., "InP-Based Active and Passive Componentsfor Communication Systems at 2μm", Journal of Lightwave Technology, Mar. 1, 2015, pp. 971-975, vol. 33, No. 5.

Yunxiao et al., "A high-efficiency high-power evanescently coupled UTC-photodiode", Journal of Semiconductors, Apr. 2009, pp. 044008-1-044008-4, vol. 30, No. 4.

Yun-Xiao et al., "High-performance evanescently-coupled uni-traveling-carrier photodiodes", Chinese Physics B, 2009, pp. 2393-2397, vol. 18, No. 6.

Zhang et al., "100 Gbit/s WDM transmission at 2 μm: transmission studies in both low-loss hollow core photonic bandgap fiber and solid core fiber", Optics Express, Feb. 2015, pp. 4946-4951, vol. 23, No. 4.

* cited by examiner

INTEGRATED PHOTODIODE WITH UNIQUE WAVEGUIDE DRIFT LAYER

RELATED APPLICATIONS

The present application is a national stage filing of International Application No. PCT/US2018/028119, filed Apr. 18, 2018, which claims benefit of priority under 35 U.S.C. § 119 (e) from U.S. Provisional Application Ser. No. 62/488,099, filed Apr. 21, 2017, entitled "Integrated Photodiode with Unique Waveguide Drift Layer" and U.S. Provisional Application Ser. No. 62/658,733, filed Apr. 17, 2018, entitled "Integrated Photodiode with Unique Waveguide Drift Layer"; the disclosures of which are hereby incorporated by reference herein in their entirety.

STATEMENT OF GOVERNMENT INTEREST

This invention was made with government support under Grant No. ECCS-1307853, awarded by The National Science Foundation. The government has certain rights in the invention.

FIELD OF INVENTION

The present disclosure relates generally to photodetectors of a waveguide type suitable for use in optical integration circuits and the like. More particularly, monolithically integrated photodiodes including a unique depleted waveguide drift layer.

BACKGROUND

Due to the growing demand for speed and capacity of telecommunication systems, high-bit rate optical fiber networks are needed in order to provide sufficient capacity for data transmission. As electronic circuitry is used for processing data which have been transferred by optical fiber networks previously, photodiodes are needed in order to convert an optical signal to an electric signal at the end of an optical fiber.

Usually, when converting an optical signal to an electronic signal, the optical power provided is absorbed by an absorption layer of the photodiode made from intrinsic semiconductor material, thereby generating pairs of electrons and holes. By providing an electric field inside the intrinsic absorption layer by means of the adjacent p- and n-contact layers, the charge carriers drift to the respective p- and n-contact layers, thereby generating an electric signal proportional to the optical signal provided. The time needed to generate the electric signal is given by the drift velocity and the drift length of the charge carriers and the time needed to reestablish the electric field given by the capacity of the photodiode and the resistance of the photodiode and its dedicated electrical signal lines. There is need for a monolithic waveguide-integrated photodiode having higher coupling efficiency. There is also a need for a photodiode with increased quantum efficiency.

SUMMARY OF EXEMPLARY EMBODIMENTS OF THE INVENTION

Photodiodes require a waveguide to direct the input signal into the photodiode, where it can be absorbed by the absorption layer. The integrated waveguide core layer is also located above the contact region, which allows for less free carrier absorption and increased quantum efficiency over previous designs. This will allow more light to be coupled into the absorption layer within a shorter device length, which will allow for a larger RC-limited time constant and the device can potentially be much faster given a particular device length. Therefore, a waveguide-integrated photodiode that uses an optically transparent, intrinsic depleted layer simultaneously as the core layer with a waveguide core layer located above the contact region is preferred, as this design will allow for more efficient light coupling into the absorber and easier fabrication.

An aspect of an embodiment of the present invention provides, among other things, a monolithic waveguide-integrated photodiode utilizing a combined optical waveguide and depleted layer for higher coupling efficiency. An aspect of an embodiment of the present invention provides, among other things, a photodiode wherein the depleted waveguide core layer is situated above the contact region for increased quantum efficiency.

An aspect of an embodiment of the present invention relates to a monolithic waveguide-integrated photodiode comprising at least one first electroconductive contact layer, having a first side and an opposing second side. Furthermore, the photodiode comprises a first waveguide cladding layer having a first side and an opposing second side, wherein the first side of the first waveguide cladding layer is located on the second side of the first electroconductive contact layer. The photodiode further comprises a waveguide core layer comprised from a semiconducting material having a first side and an opposing second side, the first side of the waveguide core layer being arranged on the second side of the first waveguide cladding layer. Furthermore, the photodiode comprises an absorption layer having a first side and an opposing second side, wherein the first side of the absorption layer is arranged on the second side of the waveguide core layer. Furthermore, the photodiode comprises a second waveguide cladding layer having a first side and an opposing second side, wherein the first side of the second waveguide cladding layer is arranged on the second side of the absorption layer. Furthermore, the photodiode comprises at least one second electroconductive contact layer having a first side and an opposing second side, wherein the first side of the second electroconductive contact layer is arranged on the second side of the second waveguide cladding layer.

An aspect of an embodiment of the present invention provides, among other things, a monolithic waveguide-integrated photodiode. The monolithic waveguide-integrated diode may comprise: at least one first electroconductive contact layer having a first side and an opposing second side; a first waveguide cladding layer having a first side and an opposing second side, wherein the first side of the first waveguide cladding layer is arranged on the second side of the first electroconductive contact layer, wherein the first electroconductive contact layer has a first refractive index and the first waveguide cladding layer has a second refractive index; a waveguide core layer comprising a layer from a semiconducting material having a first side and an opposing second side, the first side of the waveguide core layer being arranged on the second side of the first waveguide cladding layer, wherein the waveguide core layer has a third refractive index; an absorption layer having a first side and an opposing second side, wherein the first side of the absorption layer is arranged on the second side of the waveguide core layer and the absorption layer has a fourth refractive index; a second waveguide cladding layer having a first side and an opposing second side, wherein the first side of the second waveguide cladding layer is arranged on the second side of the absorption layer; and at least one second electroconductive contact layer having a first side and an opposing second side, wherein the first side of the second electroconductive contact layer is arranged on the second side of the second waveguide cladding layer, wherein the second waveguide cladding layer has a fifth refractive index and the second electroconductive contact layer has a sixth refractive index. Moreover, the monolithic waveguide-integrated diode may comprise: wherein the first refractive index of the first electroconductive contact layer is less than or equal to the second refractive index of the first waveguide cladding layer; wherein the second refractive index of the first waveguide cladding layer is lower than the third refractive index of the waveguide core layer; wherein the third refractive index of the waveguide core layer is lower than the fourth refractive index of the absorption layer; and wherein the fifth refractive index of the second waveguide cladding layer is lower than the fourth refractive index of the absorption layer.

An aspect of an embodiment of the present invention provides, among other things, a monolithic waveguide-integrated photodiode. The monolithic waveguide-integrated diode may comprise: at least one first electroconductive contact layer having a first side and an opposing second side, wherein the first electroconductive contact layer has a first refractive index; a waveguide core layer comprising a layer from a semiconducting material having a first side and an opposing second side, the first side of the waveguide core layer being arranged on the second side of the first electroconductive contact layer, wherein the waveguide core layer has a second refractive index; an absorption layer having a first side and an opposing second side, wherein the first side of the absorption layer is arranged on the second side of the waveguide core layer and the absorption layer has a third refractive index; and at least one second electroconductive contact layer having a first side and an opposing second side, wherein the first side of the second electroconductive contact layer is arranged on the second side of the absorption layer, wherein the second electroconductive contact layer has a fourth refractive index. Moreover, the monolithic waveguide-integrated diode may comprise: wherein the first refractive index of the first electroconductive contact layer is lower than the second refractive index of the waveguide core layer; wherein the second refractive index of the waveguide core layer is lower than the third refractive index of the absorption layer; and wherein the fourth refractive index of the second electroconductive contact layer is lower than the third refractive index of the absorption layer.

An aspect of an embodiment of the present invention provides, among other things, a monolithic waveguide-integrated photodiode having a first electroconductive contact layer, a depleted waveguide core layer, an absorption layer, and a second electroconductive contact layer, the refractive index of the first electroconductive contact layer being less than the depleted waveguide core layer, the refractive index of the waveguide core layer being less than the absorption layer, and the refractive index of the second electroconductive contact layer being less than the absorption layer. The waveguide core layer is arranged between the first electroconductive contact layer and the absorption layer and also acts as a depleted carrier drift layer. This arrangement results in greater quantum efficiency and shorter photodiode lengths for a given bandwidth.

An aspect of an embodiment of the present invention provide, among other things, photodetectors of a waveguide type suitable for use in optical integration circuits and the like. More particularly, the monolithically integrated photodiodes include a unique depleted waveguide drift layer. Moreover, also included is the manufacture and use of photodetectors of a waveguide type suitable for use in optical integration circuits and the like.

It should be appreciated that any of the components or modules referred to with regards to any of the present invention embodiments discussed herein, may be integrally or separately formed with one another. Further, redundant functions or structures of the components or modules may be implemented. Moreover, the various components may be communicated locally and/or remotely with any user/technician/operator/engineer or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the device and related components discussed herein may take on all shapes along the entire continual geometric spectrum of manipulation of x, y and z planes to provide and meet the anatomical, environmental, fabrication, and structural demands and operational requirements. Moreover, locations and alignments of the various components may vary as desired or required.

It should be appreciated that various sizes, dimensions, contours, rigidity, shapes, flexibility and materials of any of the components or portions of components in the various embodiments discussed throughout may be varied and utilized as desired or required.

It should be appreciated that while some dimensions are provided on the aforementioned figures, the device may constitute various sizes, dimensions, contours, rigidity, shapes, flexibility and materials as it pertains to the components or portions of components of the device, and therefore may be varied and utilized as desired or required.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. All references cited and discussed in this specification are incorporated herein by reference in their entireties and to the same extent as if each reference was individually incorporated by reference.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

The invention itself, together with further objects and attendant advantages, will best be understood by reference to the following detailed description, taken in conjunction with the accompanying drawings.

These and other objects, along with advantages and features of various aspects of embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings.

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

DETAILED DESCRIPTION OF EXEMPLARY EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of the description.

Reference throughout the specification to "an embodiment" or "one embodiment" means that a particular feature, structure, or characteristic described in connection with the embodiment is included in at least one embodiment of the present invention. Thus, the appearance of phrases "in an embodiment" or "in one embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the detailed description are hereby expressly incorporated into this detailed description, with each claim standing on its own as a separate embodiment of this invention.

Figure 1:
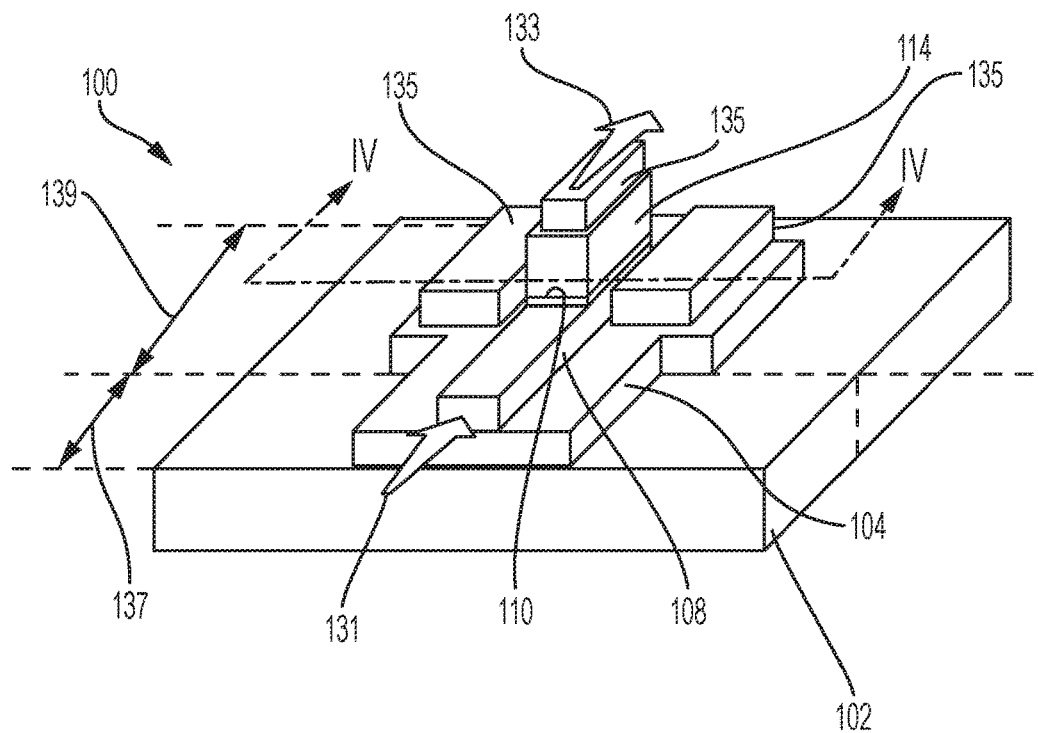
FIG. 1 schematically illustrates an aspect of an embodiment of an integrated waveguide type photodiode according to the present disclosure.

FIG. 1 schematically illustrates a perspective view of an aspect of an embodiment of a monolithic waveguide integrated photodiode according to one exemplary embodiment of the invention. The monolithic waveguide-integrated photodiode 100 in FIG. 1 may comprise a plurality of layers 104, 108, 110, and 114 which may be formed from different materials by means of different processes and which may be arranged on a substrate 102.

The substrate 102 may be made from semi-insulating material such as InP or the like. A semi-insulating material as defined here may comprise a resistivity from $10^6$-$10^8$ Ω-cm. In order to achieve this resistivity, the semi-insulating material may comprise a dopant forming deep traps in order to compensate unwanted but unavoidable impurities incorporated into the semi-insulating material. Iron may be used as a dopant in order to increase the resistivity of the semi-insulating substrate to the desired value. The substrate may have thickness ranging from 50 µm up to 500 µm (or may be thicker or thinner as desired or required). The substrate material may be formed from a single crystalline material.

Still referring to FIG. 1, for example, on the substrate 102, a first contact/waveguide cladding layer 104 is arranged. The first contact/waveguide cladding layer 104 may be made from an electroconductive or semiconductive material highly doped with impurity atoms such as Beryllium or the like and will have a lower refractive index than the not intentionally doped waveguide core layer 108. The waveguide core layer 108 may be optically transparent, depleted, and not intentionally doped (n.i.d.) and is arranged on top of the first contact/waveguide cladding layer 104. The waveguide core layer 108 acts simultaneously as the core layer of an optical waveguide in the passive photodiode region 137 and a carrier drift layer in the active photodiode region 139. Because the waveguide core layer 108 is not intentionally doped, free-carrier absorption will not contribute loss in optical transmission through the waveguide in passive photodiode region 137. The waveguide core layer 108 may be made out of a material that acts as a transparent layer for the desired wavelength of absorption of optical signal 131. The waveguide core layer 108 will guide optical signal 131 in passive optical waveguide photodiode region 137 until it reaches active photodiode region 139. At the interface of the waveguide core layer 108 transitioning from passive optical waveguide photodiode region 137 and active photodiode region 139 the optical signal 131 enters a region with a higher refractive index absorption layer 110 above the waveguide core layer 108, in which total internal reflection is then lost at the interface between the waveguide core layer 108 and the absorption layer 110. Here the optical signal 131 penetrates into the absorption layer 110, where photo-generated carriers are created, and then swept through the drift layer within the junction of the device. At this point the coplanar waveguide (CPW) circuitry 135 generates an electrical signal 133.

Still referring to FIG. 1, for example, arranged on top of the waveguide core layer is an absorption layer 110. The absorption layer 110 may include a material containing the highest index of refraction of all layers of the monolithic waveguide-integrated photodiode 100. The absorption layer 110 has an effective energy band gap that is of equal or lower energy to the desired wavelength of light to be absorbed by the monolithic waveguide-integrated photodiode 100. The first contact/waveguide cladding layer 104 and second contact/waveguide cladding layer 114 are of a lower refractive index than the absorption layer 110 and the waveguide core layer 108 has an index of refraction that is less than the absorption layer 110 and higher than the first contact/waveguide cladding layer 104 and second contact/waveguide cladding layer 114. That way the optical modes within the device can be confined in the absorption layer 110. The first contact/waveguide cladding layer 104 and second contact/waveguide cladding layer 114 are highly doped in order to form a p-n junction and act as ohmic contacts for the monolithic waveguide-integrated photodiode 100, and have a higher effective energy band gap than the absorption layer 110 in order to minimize absorption of the desired wavelength outside of the absorption layer 110.

The second contact/waveguide cladding layer 114 is arranged above the absorption layer 110 and may be air, a low-index dielectric, a similar semiconductive material, or the like.

An aspect of an embodiment of the present invention is that this is the first time the waveguide core layer 108 is made out of a not intentionally doped layer of material, which simultaneously serves as a depleted layer of the photodiode. Accordingly, an advantage to this is less free-carrier absorption of the optical signal 131. If the waveguide is made out of a doped material, there will be more free-carrier absorption, which will attenuate the light and reduces quantum efficiency. It can also lower the bandwidth of the photodiode as the free-carriers will likely slowly diffuse, if at all, out to the contacts of the device for current injection. Secondly, more light will be coupled into the absorption layer within a shorter device length. Also, the drift layer reduces the device capacitance. Therefore, the RC-limited time constant can be larger, and the device can potentially be much faster given a particular device length. In previous works, the waveguide and depletion layers are frequently two different layers. This has its share of its issues. Firstly, the core of the waveguide sits further from the absorption layer 110, meaning that the evanescent tail of the optical signal 131 has to travel a longer distance to couple into the absorption layer 110. Essentially, less light is absorbed than if the core of the waveguide was closer to the absorption region.

Additional layers not shown in FIG. 1 may be present in order to couple the contact layers 104 and 114 to external electronic devices such as capacitors, resistors, microprocessors, amplifiers, or the like. These interconnects may be made from any conductive material such as metal, an alloy, or a polycrystalline silicon. The interconnects as well as the electronic devices may be integrated monolithically on the substrate 102 together with at least one photodiode 100.

Figure 2:
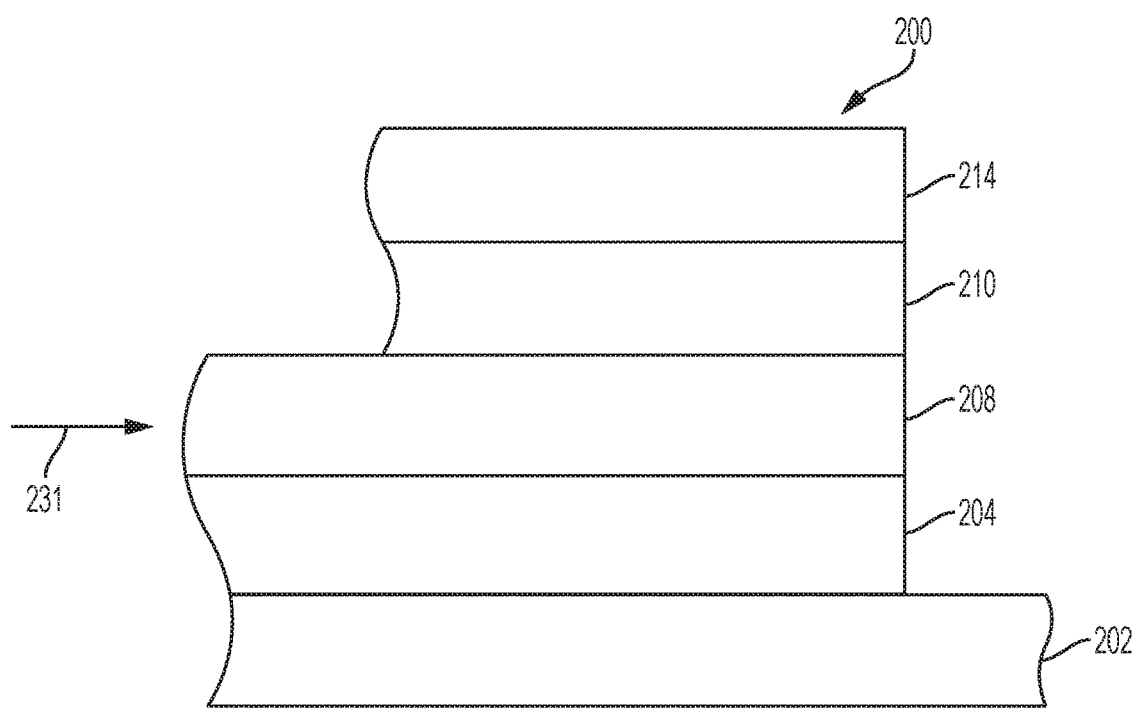
FIG. 2 schematically illustrates an aspect of an embodiment of an integrated waveguide type photodiode according to the present disclosure.

FIG. 2 schematically illustrates an aspect of an embodiment of a monolithic waveguide-integrated photodiode 200. The photodiode 200 shown in FIG. 2 may comprise a plurality of layers 204, 208, 210, and 214 which may be formed from different materials by means of different processes and which may be arranged on a substrate 202.

On the substrate 202 a first contact/waveguide cladding layer 204 is arranged. An aspect of an embodiment of the present invention is that this is the first time a waveguide core layer 208 is arranged above the first contact/waveguide cladding layer 204 in a monolithic waveguide-integrated photodiode. In one embodiment, the first contact/waveguide cladding layer 204 may be comprised of an electroconductive material highly doped with impurity atoms such as Beryllium or the like with a refractive index that is lower than the refractive index of the waveguide core layer 208. By means of the refractive index differences realized between the waveguide core layer 208 and the first contact/waveguide cladding layer 204, the optical signal 231 guided in the waveguide core layer 208 may be prematurely coupled upwards and may reach the absorption layer 210 of the photodiode on significantly shorter lengths. Thus, a more uniform illumination of the absorption layer 210 may be provided and "dark" initial areas, which have a merely electric capacitive but no absorptive effect, may largely be avoided.

Still referring to FIG. 2, for example, the width of the first contact/waveguide cladding layer 204 may equal at least the width of the waveguide core layer 208 and the absorption layer 210. In one embodiment, the width of the first contact/waveguide cladding layer 204 may be greater than the width of the absorption layer in order to allow contacts to be arranged beneath the absorption layer 210 on the top surface of the first contact/waveguide cladding layer 204. In an embodiment, the waveguide core layer 208 is monolithically integrated to serve both as a passive waveguide and a depleted layer comprised of not intentionally doped material such as InP or the like. In one embodiment this waveguide core layer 208 may be obtained by an epitaxial growth process, e.g. a metalorganic vapor phase epitaxy-process (MOVPE-process). Because the waveguide core layer 208 is arranged above the first waveguide cladding/contact layer 208, the length of these layers may be at least equal.

Still referring to FIG. 2, for example, arranged above the waveguide core layer 208 is an absorption layer 210. The absorption layer 210 may be comprised of an undoped semi-conductive material obtained through an epitaxial growth process, e.g. a MOVPE process. The absorption layer 210 may be obtained from a material comprising intrinsic InGaAs or the like. The absorption layer has a third refractive index that is greater than the waveguide core layer 208 and the first contact/waveguide cladding layer 204 and the second contact/waveguide cladding layer 214 to provide good coupling of the electromagnetic wave and to minimize optical power to couple in the second contact/waveguide cladding layer 214.

Still referring to FIG. 2, for example, arranged above the absorption layer 210 is the second contact/waveguide cladding layer 214. The second contact/waveguide cladding layer 214 may be comprised of an electroconductive material such as InGaAs or the like. The second contact/waveguide cladding layer 214 may be obtained through an epitaxial growth process, e.g. a MOVPE process. The lengths and widths of the absorption layer 210 and the second contact/waveguide cladding layer 214 may be approximately equal.

Additional layers not shown in FIG. 2 may be present in order to couple the contact layers 204 and 214 to external electronic devices such as capacitors, resistors, microprocessors, amplifiers or the like. These interconnects may be made from any conductive material such as a metal, an alloy, or a polycrystalline silicon. The interconnects as well as the electronic devices may be integrated monolithically on the substrate 202 with at least one monolithic waveguide-integrated photodiode 200.

Figure 3:
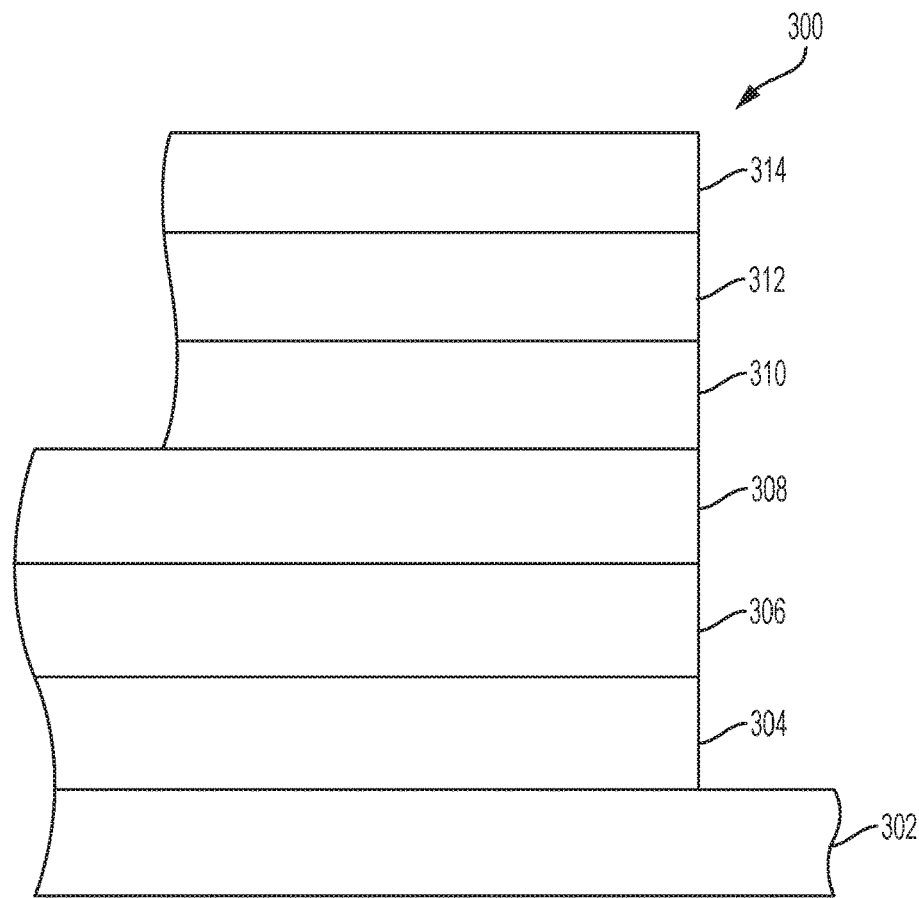
FIG. 3 schematically illustrates an aspect of an embodiment of an integrated waveguide type photodiode according to the present disclosure.

FIG. 3 schematically illustrates an aspect of an embodiment of a monolithic waveguide-integrated photodiode 300. The photodiode 300 shown in FIG. 3 may comprise a plurality of layers 304, 306, 308, 310, 312, and 314 which may be formed from different materials by means of different processes and which may be arranged on a substrate 302.

On the substrate 302 a first contact layer 304 is arranged. An aspect of an embodiment of the present invention is that this is the first time a waveguide core layer 308 is arranged above the first contact layer 304 in a monolithic waveguide-integrated photodiode. In one embodiment, the first contact layer 304 may be comprised of an electroconductive material highly doped with impurity atoms such as Beryllium or the like with a refractive index that is lower than the refractive index of the waveguide core layer 308. By means of the refractive index differences realized between the waveguide core layer 308 and the first contact layer 304, the optical signal guided in the waveguide core layer 308 may be prematurely coupled upwards and may reach the absorption layer 310 of the photodiode on significantly shorter lengths. Thus, a more uniform illumination of the absorption layer 310 may be provided and "dark" initial areas, which have a merely electric capacitive but no absorptive effect, may largely be avoided.

Still referring to FIG. 3, for example, arranged above the first contact layer 304 is the first waveguide cladding layer 306. The first waveguide cladding layer 306 may be comprised of a electroconductive metallic or dielectric material such as InGaAs or the like, or may be comprised of confined air space. The first waveguide cladding layer 306 may act to diffuse an optical signal input into the waveguide and direct the optical signal into the waveguide core layer 308.

Still referring to FIG. 3, for example, the width of the first contact layer 304 and the first waveguide cladding layer 306 may equal at least the width of the waveguide core layer 308 and the absorption layer 310. In one embodiment, the width of the first contact layer 304 and the first waveguide cladding layer 306 may be greater than the width of the absorption layer 310 in order to allow contacts to be arranged beneath the absorption layer 310 on the top surface of the first contact layer 304. In an embodiment, the waveguide core layer 308 is monolithically integrated to serve both as a passive waveguide and a depleted layer comprised of not intentionally doped material such as InP or the like. In one embodiment this waveguide core layer 308 may be obtained by an epitaxial growth process, e.g. a MOVPE-process. Because the waveguide core layer 308 is arranged above the first contact layer 308, the length of these layers may be at least equal.

Still referring to FIG. 3, for example, arranged above the waveguide core layer 308 is the absorption layer 310. The absorption layer 310 may be comprised of an undoped semi-conductive material obtained through an epitaxial growth process, e.g. a MOVPE process. In an embodiment, the absorption layer 310 may be obtained from a material comprising intrinsic InGaAs. The absorption layer has a third refractive index that is greater than the waveguide core layer 308 and the first contact layer 304 and the second contact layer 314 to provide good coupling of the electromagnetic wave and to minimize optical power to couple in the second contact layer 314.

Still referring to FIG. 3, for example, arranged above the absorption layer 310 is the second waveguide cladding layer 312 and the second contact layer 314. The second waveguide cladding layer 312 may be comprised of a metallic or dielectric material such as InGaAs or the like or confined air space. The second contact layer 314 may be comprised of an electroconductive material such as InGaAs or the like. The second contact layer 314 may be obtained through an epitaxial growth process, e.g. a MOVPE process. The lengths and widths of the absorption layer 310 and the second waveguide cladding layer 312 and the second contact layer 314 may be approximately equal.

Additional layers not shown in FIG. 3 may be present in order to couple the contact layers 304 and 314 to external electronic devices such as capacitors, resistors, microprocessors, amplifiers or the like. These interconnects may be made from any conductive material such as a metal, an alloy, or a polycrystalline silicon. The interconnects as well as the electronic devices may be integrated monolithically on the substrate 302 with at least one monolithic waveguide-integrated photodiode 300.

Figure 4:
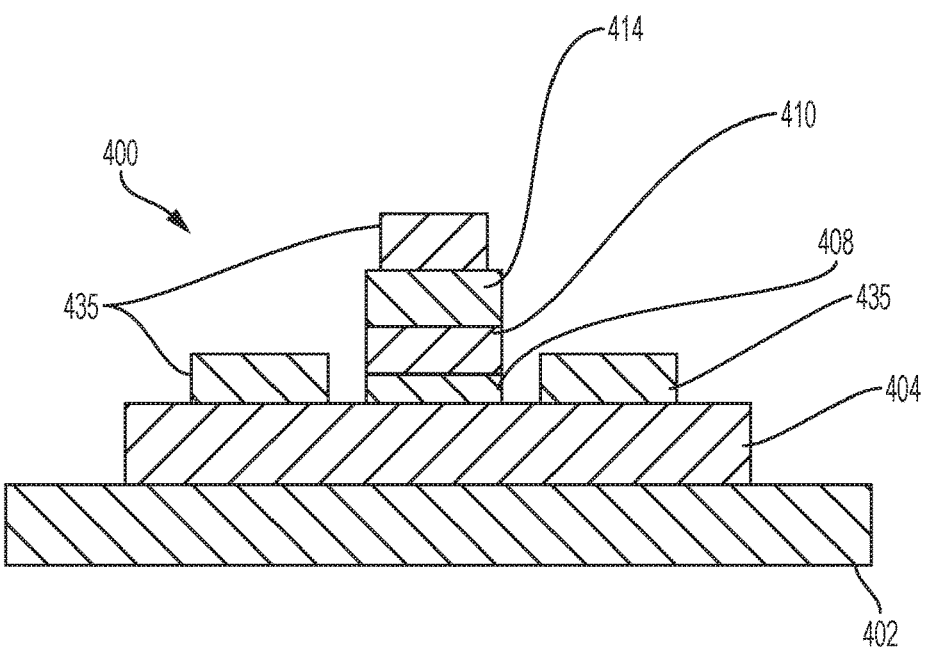
FIG. 4 shows a sectional view of the photodiode of FIG. 1 (looking in the direction of arrows IV-IV) schematically illustrating an aspect of an embodiment of an integrated waveguide type photodiode according to the present disclosure.

FIG. 4 shows a sectional view of the photodiode of FIG. 1 (looking in the direction of arrows IV-IV) schematically illustrating an aspect of an embodiment of an integrated waveguide type photodiode according to the present disclosure. The photodiode 400 shown in FIG. 4 comprises a plurality of layers 404, 408, 410, and 414 which may be formed from different materials by means of different processes and which may be arranged on a substrate 402.

Referring to FIG. 4, for example, on the substrate 402 a first contact/waveguide cladding layer 404 is arranged. This is the first time a waveguide core layer 408 is arranged above the first contact/waveguide cladding layer 404 in a monolithic waveguide-integrated photodiode. In one embodiment, the first contact/waveguide cladding layer 404 may be comprised of an electroconductive material highly doped with impurity atoms such as Beryllium or the like with a refractive index that is lower than the refractive index of the waveguide core layer 408. By means of the refractive index differences realized between the waveguide core layer 408 and the first contact/waveguide cladding layer 404, the optical signal guided in the waveguide core layer 408 may be prematurely coupled upwards and may reach the absorption layer 410 of the photodiode on significantly shorter lengths. Thus, a more uniform illumination of the absorption layer 410 may be provided and "dark" initial areas, which have a merely electric capacitive but no absorptive effect, may largely be avoided.

Still referring to FIG. 4, for example, the width of the first contact/waveguide cladding layer 404 may equal at least the width of the waveguide core layer 408 and the absorption layer 410. In one embodiment, the width of the first contact/waveguide cladding layer 404 may be greater than the width of the absorption layer in order to allow contacts to be arranged beneath the absorption layer 410 on the top surface of the first contact/waveguide cladding layer 404. In an embodiment, the waveguide core layer 408 is monolithically integrated to serve both as a passive waveguide and a depleted layer comprised of not intentionally doped material such as InP or the like. In one embodiment this waveguide core layer 408 may be obtained by an epitaxial growth process, e.g. a MOVPE-process. Because the waveguide core layer 408 is arranged above the first waveguide cladding/contact layer 408, the length of these layers may be at least equal.

Arranged above the waveguide core layer 408 is absorption layer 410. The absorption layer 410 may be comprised of an undoped semi-conductive material obtained through an epitaxial growth process, e.g. a MOVPE process. The absorption layer 410 may be obtained from a material comprising intrinsic InGaAs. The absorption layer has a third refractive index that is greater than the waveguide core layer 408 and the first contact/waveguide cladding layer 404 and the second contact/waveguide cladding layer 414 to provide good coupling of the electromagnetic wave and to minimize optical power to couple in the second contact/waveguide cladding layer 414.

Still referring to FIG. 4, for example, arranged above the absorption layer 410 is the second contact/waveguide cladding layer 414. The second contact/waveguide cladding layer 414 may be comprised of an electroconductive material such as InGaAs or the like. The second contact/waveguide cladding layer 414 may be obtained through an epitaxial growth process, e.g. a MOVPE process. The lengths and widths of the absorption layer 410 and the second contact/waveguide cladding layer 414 may be approximately equal.

Additional layers not shown in FIG. 4 may be present in order to couple the contact layers 404 and 414 to external electronic devices such as capacitors, resistors, microprocessors, amplifiers or the like in CPW circuitry 435. These interconnects may be made from any conductive material such as a metal, an alloy, or a polycrystalline silicon. The interconnects as well as the electronic devices may be integrated monolithically on the substrate 402 with at least one monolithic waveguide-integrated photodiode 400.

In the foregoing, the invention has been described on a single photodiode as an example. Those skilled in the art will realize, that the invention may also be used for all derived combined photodetector configurations consisting of single photodiodes, such as differential twin photodetectors, balanced photodetectors or travelling wave photodetectors comprising serial or parallel optical supply of the single photodiodes, which use the features of the inventive photodiode.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention. Embodiments of the invention have been described in the form of functional elements such as a first waveguide cladding/contact layer 104, a waveguide core layer 108, an absorption layer 110, and a second waveguide cladding/contact layer 114. Those elements may be realized in different embodiments and may be obtained by different manufacturing processes. Embodiments of the invention do not rely on the strict realization of a certain embodiment. The interconnects between the first waveguide cladding/contact layer 104, second waveguide cladding/contact layer 114, and further functional elements may couple to functional elements described herein directly or may comprise further functional elements. The description is thus to be regarded as illustrative instead of limiting.

EXAMPLES

Practice of an aspect of an embodiment (or embodiments) of the invention will be still more fully understood from the following examples and experimental results, which are presented herein for illustration only and should not be construed as limiting the invention in any way.

Examples and Experimental Results Set No. 1

High Speed InP-based Type-II Multiple Quantum Well Integrated Waveguide Photodiode at 2.0-µm Wavelength An aspect of an embodiment provides a high-speed integrated waveguide photodetector exhibiting a dark current of 2 nA at −2 V with an internal responsivity of 0.25 A/W and a 3-dB bandwidth above 8 GHz at 2 µm wavelength.

Forecasts on data demands made by the Internet of Things (IoT) require an expansion of data transmission capacity of current optical fiber communications systems. One way of achieving this is to extend data channels from the near-infrared into the mid-infrared region of the electromagnetic spectrum. With recent advancements in Hollow Core Photonics Bandgap Fibers (HC-PBGF) technology, the spectral region around 2 µm offers a promising potential spectral region to exploit as a part of this bandwidth push Optoelectronics devices such as lasers and optical amplifiers have already been developed for operation at 2 µm, but there exist only a few options for integrated high-speed photodetectors. Early developments on high-speed photodiodes on InP substrates with 80 pairs of InGaAs/GaAsSb type-II quantum wells (QWs) as the absorber layer have been demonstrated in the past. In this example, a structure with fewer pairs is developed to provide a high-speed waveguide photodiode capable of achieving, among other things, a 3-dB bandwidth above 8 GHz at 2 µm that is readily integratable in indium phosphide photonic integrated circuits.

Device Design and Fabrication

Figure 5:
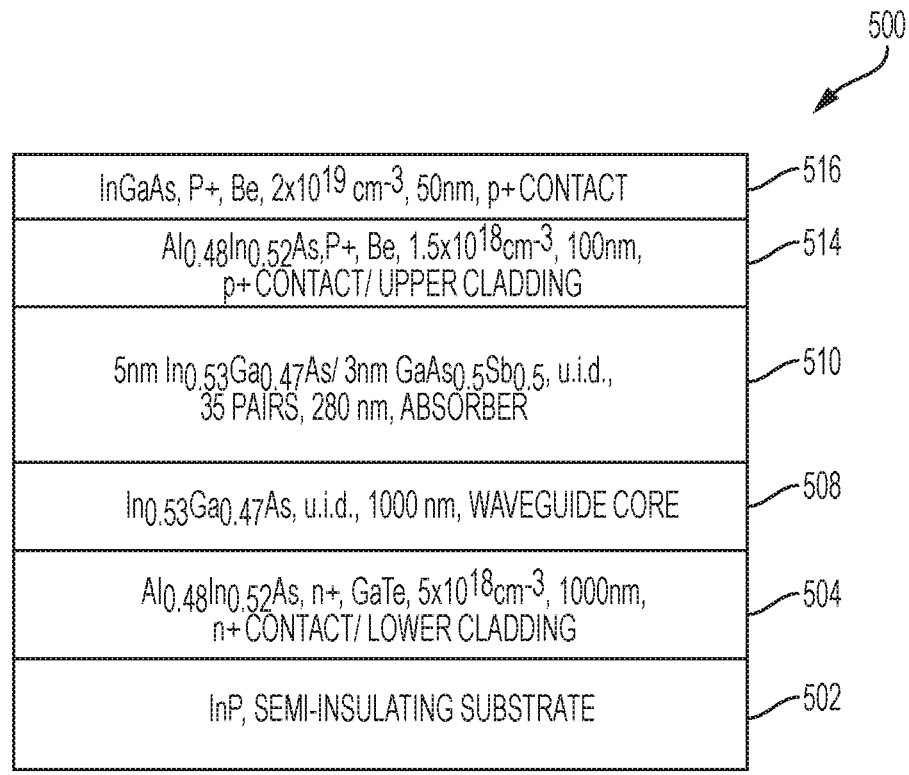
FIG. 5 schematically illustrates an epitaxial layer stack of the photodiode.

Referring to FIG. 5, FIG. 5 schematically illustrates an epitaxial layer stack of the photodiode (PD) 500, which was grown with molecular beam epitaxy (MBE). A p-i-n structure was used, with two unintentionally doped depletion layers 508 and 510; one absorption layer 510 that absorbs light at 2 µm using type-II InGaAs/GaAsSb quantum wells, and one waveguide core layer 508 that consists solely of InGaAs, which is transparent to 2 µm wavelength light. The transparent depletion layer, which is used to reduce the capacitance of the photodiode (PD), also, simultaneously serves as the high-index waveguide core layer 508 of the input optical waveguide. From the waveguide core layer 508, light couples evanescently into the absorbing layer 510, which absorbs light at 2 µm with an absorption coefficient of about 1000 cm$^{-1}$. The low-index n+ contact layer 504 acts as a bottom cladding layers for the waveguide 508. The absorption layer 510 contains 35 pairs of quantum wells, each of which consists of a 5 nm $In_{0.53}Ga_{0.47}As$ barrier layer and a 3 nm $Ga_{0.5}As_{0.5}Sb$ well layer designed to be lattice-matched to InP. The thicknesses of the well and barrier layers were designed to provide a cut-off wavelength of absorption at 2.3 µm, and minimize carrier transit-time in the photodiode (PD) device 500, by reducing the carrier escape times and tunneling rates within the quantum wells. Double mesa photodiodes with 4-µm wide input waveguides were fabricated and passivated with $SiO_2$. Contained above the waveguide core layer 508 and absorption layer 510 are a p+ contact/upper cladding layer 514 and a p+ contact layer 516 ensuring increased quantum efficiency and minimized free carrier absorption. Finally, metal was deposited on the photodiode 500, and coplanar waveguide pads were deposited on an SU-8 insulation layer and connected to the metal on the photodiode 500.

Figure 6:
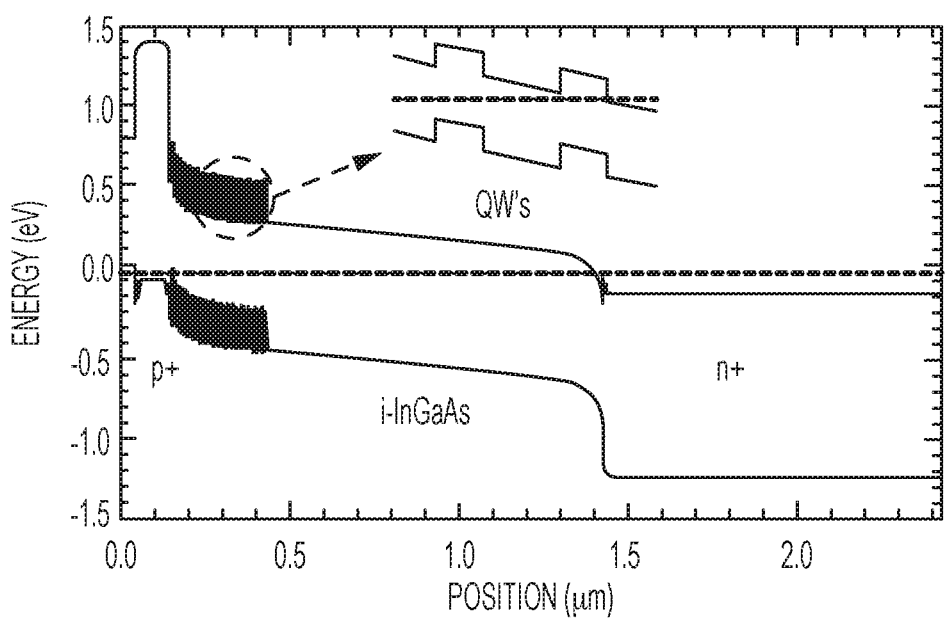
FIG. 6 graphically illustrates a simulated band structure of the photodiode of FIG. 5.

FIG. 6 shows the simulated band diagram of the photodiode shown in FIG. 5.

Measurement Results

Figure 7:
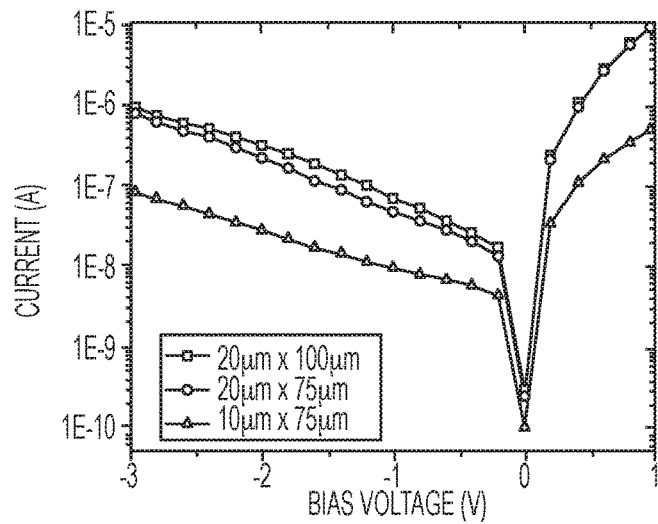
FIG. 7 graphically illustrates current-voltage (I-V) curves of photodiodes with different active areas.
Figure 8:
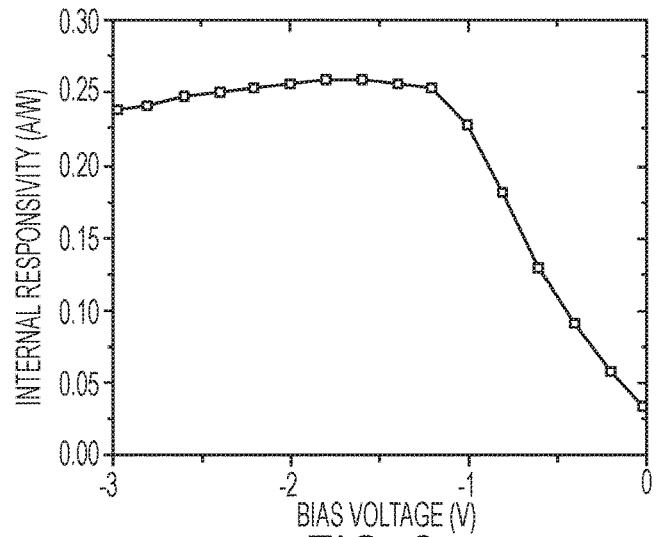
FIG. 8 graphically illustrates an internal responsivity at 2 μm as a function of voltage.

FIG. 7 graphically illustrates the dark currents of photodiodes with different active areas, which was measured to be as low as 2 nA at −2 V at room temperature from a 10 µm×50 µm PD. Under 2 µm wavelength illumination and −1 V bias on a 10 µm×50 µm PD, the measured external responsivity is 0.05 A/W, which, after excluding 7 dB total loss from fiber coupling and reflection at the waveguide facet, corresponds to 0.25 A/W internal responsivity, as graphically shown in FIG. 8.

Figure 9:
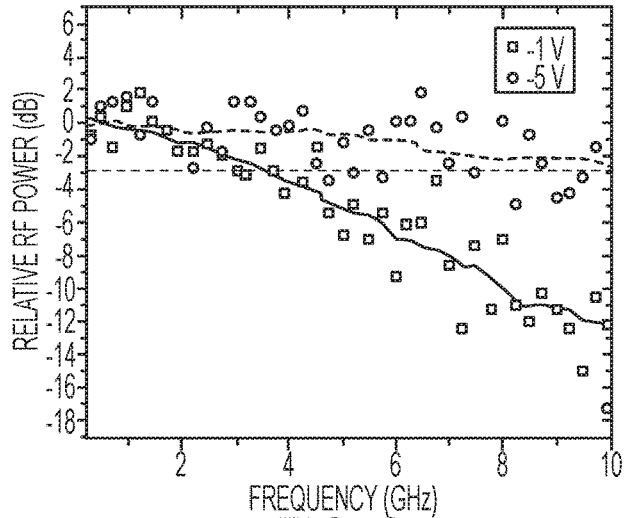
FIG. 9 graphically illustrates an O-E bandwidth at 2 μm illumination under different voltages. The circles and squares represent measured data of −5V and −1V, respectively; and heavy-dashed line curve and solid line curve represent averaged data of −5V and −1V, respectively.

We also measured a 3-dB bandwidth above 8 GHz at 2 µm using an E-O intensity modulator and an electrical spectrum analyzer (ESA). The average data curve shown in FIG. 9 shows a bandwidth above 10 GHz. The circles and squares represent measured data of −5V and −1V, respectively; and heavy-dashed line curve and solid line curve represent averaged data of −5V and −1V, respectively. There is a strong bias dependence on the bandwidth due to varying carrier capture and release rates within the quantum wells in the absorber layer of the device. The thermionic emission of carriers out of the wells is a strong function of the energy levels of the trapped carriers, which varies with applied electric field. A faster carrier transit time can be achieved by altering the well and barrier thicknesses and compositions in order to reduce the effective barrier heights of the quantum well and effectively reduce the escape time of the carriers that are generated within the quantum wells.

Summary

An integrated waveguide photodiode (PD) 500 based on multiple InGaAs/GaAsSb quantum wells grown on an InP substrate 502 was successfully designed and fabricated. The photodiodes (PD) 500 exhibit a low dark current of 2 nA at −2V and 0.25 A/W internal responsivity at −1 V under 2 µm optical illumination. We also measured a O-E photodiode (PD) bandwidth of at least 8 GHz under 2 µm excitation.

Additional Examples

Example 1

A monolithic waveguide-integrated photodiode comprising:

at least one first electroconductive contact layer having a first side and an opposing second side;

a first waveguide cladding layer having a first side and an opposing second side, wherein the first side of the first waveguide cladding layer is arranged on the second side of said first electroconductive contact layer, wherein said first electroconductive contact layer has a first refractive index and said first waveguide cladding layer has a second refractive index;

a waveguide core layer comprising a layer from a semiconducting material having a first side and an opposing second side, the first side of said waveguide core layer being arranged on the second side of said first waveguide cladding layer, wherein said waveguide core layer has a third refractive index;

an absorption layer having a first side and an opposing second side, wherein the first side of said absorption layer is arranged on the second side of said waveguide core layer and said absorption layer has a fourth refractive index;

a second waveguide cladding layer having a first side and an opposing second side, wherein the first side of said second waveguide cladding layer is arranged on the second side of said absorption layer;

at least one second electroconductive contact layer having a first side and an opposing second side, wherein the first side of said second electroconductive contact layer is arranged on the second side of said second waveguide cladding layer, wherein said second waveguide cladding layer has a fifth refractive index and said second electroconductive contact layer has a sixth refractive index;

wherein the first refractive index of said first electroconductive contact layer is less than or equal to the second refractive index of said first waveguide cladding layer;

wherein the second refractive index of said first waveguide cladding layer is lower than (or less than or equal to) the third refractive index of said waveguide core layer;

wherein the third refractive index of said waveguide core layer is lower than (or less than or equal to) the fourth refractive index of said absorption layer; and wherein the fifth refractive index of said second waveguide cladding layer is lower than (or less than or equal to) the fourth refractive index of said absorption layer.

Example 2

The photodiode of example 1, wherein the sixth refractive index of said second electroconductive contact layer is less than or equal to the fifth refractive index of said second waveguide cladding layer.

Example 3

The photodiode of example 1 (as well as subject matter in whole or in part of example 2), wherein the sixth refractive index of said second electroconductive contact layer is greater than (or greater than or equal to) the fifth refractive index of said second waveguide cladding layer and wherein the sixth refractive index of said second electroconductive contact layer is lower than (or less than or equal to) the fourth refractive index of said absorption layer.

Example 4

The photodiode of example 1 (as well as subject matter of one or more of any combination of examples 2-3, in whole or in part), wherein said waveguide core layer is not intentionally doped.

Example 5

The photodiode of example 1 (as well as subject matter of one or more of any combination of examples 2-4, in whole or in part), wherein said waveguide core layer is lightly doped.

Example 6

The photodiode of example 1 (as well as subject matter of one or more of any combination of examples 2-5, in whole or in part), wherein said waveguide core layer is depleted.

Example 7

The photodiode of example 1 (as well as subject matter of one or more of any combination of examples 2-6, in whole or in part), wherein said first waveguide cladding layer comprises a metallic material, dielectric material, semiconductor material or confined air space.

Example 8

The photodiode of example 1 (as well as subject matter of one or more of any combination of examples 2-7, in whole or in part), wherein said second waveguide cladding layer comprises a metallic material, dielectric material, semiconductor material or confined air space.

Example 9

The photodiode of example 1 (as well as subject matter of one or more of any combination of examples 2-8, in whole or in part), wherein said first electroconductive contact layer comprises an n-type electroconductive contact layer and wherein said second electroconductive contact layer comprises a p-type electroconductive contact layer.

Example 10

The photodiode of example 1 (as well as subject matter of one or more of any combination of examples 2-9, in whole or in part), wherein said first electroconductive contact layer comprises a p-type electroconductive contact layer and wherein said second electroconductive contact layer comprises an n-type electroconductive contact layer.

Example 11

The photodiode of example 1 (as well as subject matter of one or more of any combination of examples 2-10, in whole or in part), further comprising a substrate layer having a first side and an opposing second side, wherein the first side of said first electroconductive contact layer is located on the second side of said substrate layer.

Example 12

A monolithic waveguide-integrated photodiode comprising:
at least one first electroconductive contact layer having a first side and an opposing second side, wherein said first electroconductive contact layer has a first refractive index;
a waveguide core layer comprising a layer from a semiconducting material having a first side and an opposing second side, the first side of said waveguide core layer being arranged on the second side of said first electroconductive contact layer, wherein said waveguide core layer has a second refractive index;
an absorption layer having a first side and an opposing second side, wherein the first side of said absorption layer is arranged on the second side of said waveguide core layer and said absorption layer has a third refractive index;
at least one second electroconductive contact layer having a first side and an opposing second side, wherein the first side of said second electroconductive contact layer is arranged on the second side of said absorption layer, wherein said second electroconductive contact layer has a fourth refractive index;
wherein the first refractive index of said first electroconductive contact layer is lower than (or less than or equal to) the second refractive index of said waveguide core layer;
wherein the second refractive index of said waveguide core layer is lower than (or less than or equal to) the third refractive index of said absorption layer; and
wherein the fourth refractive index of said second electroconductive contact layer is lower than (or less than or equal to) the third refractive index of said absorption layer.

Example 13

The photodiode of example 12, wherein said first electroconductive contact layer is configured to act as a first waveguide cladding layer.

Example 14

The photodiode of example 13 (as well as subject matter in whole or in part of example 12), further comprising a second waveguide cladding layer having a first side and an opposing second side, wherein the first side of said second waveguide cladding layer is located on the second side of said absorption layer and wherein the second side of said second waveguide cladding layer is located on the first side of said second electroconductive contact layer.

Example 15

The photodiode of example 14, wherein said second waveguide cladding layer has a fifth refractive index, wherein the fourth refractive index of said second electroconductive contact layer is less than or equal to the fifth refractive index of said second waveguide cladding layer.

Example 16

The photodiode of example 14, wherein said second waveguide cladding layer has a fifth refractive index, wherein the fourth refractive index of said second electroconductive contact layer is greater than (or greater than or equal to) the fifth refractive index of said second waveguide cladding layer.

Example 17

The photodiode of example 15 (as well as subject matter of one or more of any combination of examples 13-14 or 16, in whole or in part), wherein the fifth refractive index of said second waveguide cladding layer is lower than (or less than or equal to) the third refractive index of said absorption layer.

Example 18

The photodiode of example 12 (as well as subject matter of one or more of any combination of examples 13-17, in whole or in part), wherein said second electroconductive contact layer is configured to act as a second waveguide cladding layer.

Example 19

The photodiode of example 18 (as well as subject matter of one or more of any combination of examples 13-17, in whole or in part), further comprising a first waveguide cladding layer having a first side and an opposing second side, wherein the first side of said first waveguide cladding layer is located on the second side of said first electroconductive contact layer and wherein the second side of said first waveguide cladding layer is located on the first side of said waveguide core layer.

Example 20

The photodiode of example 19 (as well as subject matter of one or more of any combination of examples 13-18, in whole or in part), wherein said first waveguide cladding layer has a sixth refractive index, wherein the first refractive index of said first electroconductive contact layer is less than or equal to the sixth refractive index of said first waveguide cladding layer.

Example 21

The photodiode of example 20 (as well as subject matter of one or more of any combination of examples 13-19, in whole or in part), wherein the sixth refractive index of said first waveguide cladding layer is lower than (or less than or equal to) the second refractive index of said waveguide core layer.

Example 22

The photodiode of example 12 (as well as subject matter of one or more of any combination of examples 13-21, in whole or in part), wherein the first electroconductive contact layer is configured to act as a first waveguide cladding layer and the second electroconductive contact layer is configured to act as a second waveguide cladding layer.

Example 23

The photodiode of example 12 (as well as subject matter of one or more of any combination of examples 13-22, in whole or in part), wherein said waveguide core layer is not intentionally doped.

Example 24

The photodiode of example 12 (as well as subject matter of one or more of any combination of examples 13-23, in whole or in part), wherein said waveguide core layer is lightly doped.

Example 25

The photodiode of example 12 (as well as subject matter of one or more of any combination of examples 13-24, in whole or in part), wherein said waveguide core layer is depleted.

Example 26

The photodiode of example 14 (as well as subject matter of one or more of any combination of examples 15-25, in whole or in part), wherein said second waveguide cladding layer comprises a metallic material, dielectric material, semiconductor material or confined air space.

Example 27

The photodiode of example 19 (as well as subject matter of one or more of any combination of examples 13-18 and 20-26, in whole or in part), wherein said first waveguide cladding layer comprises a metallic material, dielectric material, semiconductor material, or confined air space.

Example 28

The photodiode of example 12 (as well as subject matter of one or more of any combination of examples 13-27, in whole or in part), wherein said first electroconductive contact layer comprises an n-type electroconductive contact layer and wherein said second electroconductive contact layer comprises a p-type electroconductive contact layer.

Example 29

The photodiode of example 12 (as well as subject matter of one or more of any combination of examples 13-28, in whole or in part), wherein said first electroconductive contact layer comprises a p-type electroconductive contact layer and wherein said second electroconductive contact layer comprises an n-type electroconductive contact layer.

Example 30

The photodiode of example 12 (as well as subject matter of one or more of any combination of examples 13-29, in whole or in part), further comprising a substrate layer having a first side and an opposing second side, wherein the first side of said first electroconductive contact layer is located on the second side of said substrate layer.

Example 31

A monolithic waveguide-integrated photodiode comprising:
at least one first electroconductive contact layer having a first side and an opposing second side;
a first waveguide cladding layer having a first side and an opposing second side, wherein the first side of the first waveguide cladding layer is arranged on the second side of said first electroconductive contact layer, wherein said first electroconductive contact layer has a first refractive index and said first waveguide cladding layer has a second refractive index;

a waveguide core layer comprising a layer from a semiconducting material having a first side and an opposing second side, the first side of said waveguide core layer being arranged on the second side of said first waveguide cladding layer, wherein said waveguide core layer has a third refractive index;

an absorption layer having a first side and an opposing second side, wherein the first side of said absorption layer is arranged on the second side of said waveguide core layer and said absorption layer has a fourth refractive index;

a second waveguide cladding layer having a first side and an opposing second side, wherein the first side of said second waveguide cladding layer is arranged on the second side of said absorption layer; and at least one second electroconductive contact layer having a first side and an opposing second side, wherein the first side of said second electroconductive contact layer is arranged on the second side of said second waveguide cladding layer, wherein said second waveguide cladding layer has a fifth refractive index and said second electroconductive contact layer has a sixth refractive index.

Example 32

A monolithic waveguide-integrated photodiode comprising:

at least one first electroconductive contact layer having a first side and an opposing second side, wherein said first electroconductive contact layer has a first refractive index;

a waveguide core layer comprising a layer from a semiconducting material having a first side and an opposing second side, the first side of said waveguide core layer being arranged on the second side of said first electroconductive contact layer, wherein said waveguide core layer has a second refractive index;

an absorption layer having a first side and an opposing second side, wherein the first side of said absorption layer is arranged on the second side of said waveguide core layer and said absorption layer has a third refractive index; and at least one second electroconductive contact layer having a first side and an opposing second side, wherein the first side of said second electroconductive contact layer is arranged on the second side of said absorption layer, wherein said second electroconductive contact layer has a fourth refractive index.

Example 33

The method of manufacturing or fabricating of any of monolithic waveguide-integrated diodes, or their components provided in any one or more of examples 1-32, in whole or in part. The method of manufacturing or fabricating of any of monolithic waveguide-integrated diodes, or their components provided in this disclosure or cited and/or incorporated by reference in this disclosure. The method of manufacturing or fabricating of any of monolithic waveguide-integrated diodes, or their components using any of the materials or compositions provided in this disclosure or cited and/or incorporated by reference in this disclosure.

Example 34

The method of manufacturing or fabricating of any of compositions, devices, systems, apparatuses, assemblies, or their components provided in any one or more of examples 1-32, in whole or in part. The method of manufacturing or fabricating of any of compositions, devices, systems, apparatuses, assemblies, or their components provided in this disclosure or cited and/or incorporated by reference in this disclosure. The method of manufacturing or fabricating of any of compositions, devices, systems, apparatuses, assemblies, or their components using any of the materials or compositions provided in this disclosure or cited and/or incorporated by reference in this disclosure.

Example 35

The photodiode of example 31 including subject matter of one or more of any combination of examples 1-11, in whole or in part.

Example 36

The photodiode of example 32 including subject matter of one or more of any combination of examples 12-30, in whole or in part.

Example 37

The method of using any of monolithic waveguide-integrated diodes, or their components provided in any one or more of examples 1-32, in whole or in part.

Example 38

The method of using any of compositions, devices, systems, apparatuses, assemblies, or their components provided in any one or more of examples 1-32, in whole or in part.

REFERENCES

The devices, systems, apparatuses, compositions, materials, machine readable medium, computer program products, and methods of various embodiments of the invention disclosed herein may utilize aspects disclosed in the following references, applications, publications and patents and which are hereby incorporated by reference herein in their entirety, and which are not admitted to be prior art with respect to the present invention by inclusion in this section:

1. U.S. Pat. No. 5,285,514, Nojiri H., et al., "Waveguide Type Photodetector and a Method of Fabricating the Same", Feb. 8, 1994.

2. U.S. Patent Application Publication No. US 2009/0057796 A1, Bach, et al., "Photodiode Being Monolithically Integrated Onto a Waveguide", Mar. 5, 2009.

3. U.S. Pat. No. 7,868,406 B2, Bach, et al., "Photodiode Being Monolithically Integrated Onto a Waveguide", Jan. 11, 2011.

4. Zhang Yunxiao, et al., "A high efficiency high-power evanescently coupled UTC-photodiode", Vol. 30, No. 4, April 2009.

5. Zhang Yunxiao, et al., "High performance evanescently-coupled uni-traveling-carrier photodiodes", Chinese Physics B, Vol. 18, No. 6, June 2009.

6. Deri, R., et al., "Efficient vertical coupling of photodiodes to InGaAsP rib waveguides", Appl. Phys. Lett. 58 (24), 17 Jun. 1991.

7. Deri, R., et al., "Integrated waveguide/photodiodes using vertical impedance matching", Appl. Phys. Lett. 56 (18), 30 Apr. 1990.

8. Klamkin, J., et al., "Uni-traveling carrier variable confinement waveguide photodiodes", May 23, 2011.

9. Kato, K, et al., "A high-efficiency 60 GHz InGaAs multimode waveguide photodetector", IEEE Journal of Quantum Electronics, Vol. 28, Issue 12, December 1992.

10. Cinguino, P., et al., "Monolithic integrated InGaAlAs-InP ridge waveguide photodiodes for 1.55 µm operation grown by molecular beam epitaxy", Appl. Phys. Lett. 50 (21), 25 May 1987.

11. U.S. patent application Ser. No. 13/724,596 entitled "HIGH BANDWIDTH, MONOLITHIC TRAVELING WAVE PHOTODIODE ARRAY", filed Dec. 21, 2012; Publication No. US-2013-0113063-A1, May 9, 2013; U.S. patent application Ser. No. 12/822,518 entitled "High Bandwidth, Monolithic Traveling Wave Photodiode Array", filed Jun. 24, 2010; Publication No. 2010/0327382, Dec. 30, 2010.

12. U.S. Pat. No. 5,263,111, Nurse, et al., "Optical Waveguide Structures and Formation Methods", Nov. 16, 1993.

13. U.S. Pat. No. 6,177,710 B1, Nishikata, et al., "Semiconductor Waveguide Type Photodetector and Method for Manufacturing the Same", Jan. 23, 2001.

14. U.S. Pat. No. 5,991,487, Sugiyama, M., "Silicon-Based Semiconductor Photodetector with an Improved Thin Optical Waveguide Layer", Nov. 23, 1999.

15. U.S. Pat. No. 7,095,938 B2, Tolstikhin, V., "Vertical Integration of Active Devices with Passive Semiconductor Waveguides", Aug. 22, 2006.

16. U.S. Pat. No. 4,835,575, Plihal, M., "Monolithically Integrated Waveguide-Photodiode Combination", May 30, 1989.

17. U.S. Pat. No. 8,861,909 B2, Lipson, et al., "Polysilicon Photodetector, Methods and Applications, Oct. 14, 2014.

18. U.S. Pat. No. 7,515,793 B2, Dehlinger, et al., "Waveguide Photodetector", Apr. 7, 2009.

19. U.S. Pat. No. 7,120,350 B2, Block, et al., "Integrated Waveguide Photodetector", Oct. 10, 2006.

20. Tossoun, B., et al., "High Speed InP-based Type-II Multiple Quantum Well Integrated Waveguide Photodiode at 2.0-µm Wavelength," *Integrated Photonics Research, Silicon and Nanophotonics*. Optical Society of America, 2018.

21. A. Luigi, A. Iera, G. Morabito, "The internet of things: A survey", *Comput. Netw.*, vol. 54, no. 15, pp. 2787-2805, 2010.

22. H. Zhang et al., "100 Gbit/s WDM transmission at 2 µm: Transmission studies in both low-loss hollow core photonic bandgap fiber and solid core fiber," *Opt. Exp.*, vol. 23, no. 4, pp. 4946-4951, 2015.

23. N. Ye, M. R. Gleeson, M. U. Sadiq, and B. Corbett, "InP-based active and passive components for communication systems at 2 µm," *J. Lightw. Technol.*, vol. 33, no. 5, pp. 971-975, Mar. 1, 2015.

24. B. Tossoun, R. Stephens, Jr., Y. Wang, S. Addamane, G. Balakrishnan, A. Holmes, Jr., and A. Beling, "High-Speed InP-Based p-i-n Photodiodes With InGaAs/GaAsSb Type-II Quantum Wells," *IEEE Photonics Technology Letters.*, Vol. 30, No. 4, February, 2018.

25. Shen, L., et al., "High-bandwidth unit-traveling carrier waveguide photodetector on an InP-membrane-on-silicon platform", Optics Express 8291, Apr. 18, 2016, Vol. 24, No. 8, DOI: 10.1364/OE.24.008290.

Unless clearly specified to the contrary, there is no requirement for any particular described or illustrated activity or element, any particular sequence or such activities, any particular size, speed, material, duration, contour, dimension or frequency, or any particularly interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. It should be appreciated that aspects of the present invention may have a variety of sizes, contours, shapes, compositions and materials as desired or required.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. A monolithic waveguide-integrated photodiode comprising:
   at least one first electroconductive contact layer having a first side and an opposing second side;

a first waveguide cladding layer having a first side and an opposing second side, wherein the first side of the first waveguide cladding layer is arranged on the second side of said first electroconductive contact layer, wherein said first electroconductive contact layer has a first refractive index and said first waveguide cladding layer has a second refractive index;

a waveguide core layer comprising a layer from a semiconducting material having a first side and an opposing second side, the first side of said waveguide core layer being arranged on the second side of said first waveguide cladding layer, wherein said waveguide core layer has a third refractive index;

an absorption layer having a first side and an opposing second side, wherein the first side of said absorption layer is arranged on the second side of said waveguide core layer and said absorption layer has a fourth refractive index;

a second waveguide cladding layer having a first side and an opposing second side, wherein the first side of said second waveguide cladding layer is arranged on the second side of said absorption layer;

at least one second electroconductive contact layer having a first side and an opposing second side, wherein the first side of said second electroconductive contact layer is arranged on the second side of said second waveguide cladding layer, wherein said second waveguide cladding layer has a fifth refractive index and said second electroconductive contact layer has a sixth refractive index;

wherein the first refractive index of said first electroconductive contact layer is less than or equal to the second refractive index of said first waveguide cladding layer;

wherein the second refractive index of said first waveguide cladding layer is lower than the third refractive index of said waveguide core layer;

wherein the third refractive index of said waveguide core layer is lower than the fourth refractive index of said absorption layer; and wherein the fifth refractive index of said second waveguide cladding layer is lower than the fourth refractive index of said absorption layer.

2. The photodiode of claim 1, wherein the sixth refractive index of said second electroconductive contact layer is less than or equal to the fifth refractive index of said second waveguide cladding layer.

3. The photodiode of claim 1, wherein the sixth refractive index of said second electroconductive contact layer is greater than the fifth refractive index of said second waveguide cladding layer and wherein the sixth refractive index of said second electroconductive contact layer is lower than the fourth refractive index of said absorption layer.

4. The photodiode of claim 1, wherein said waveguide core layer is not intentionally doped.

5. The photodiode of claim 1, wherein said waveguide core layer is lightly doped.

6. The photodiode of claim 1, wherein said waveguide core layer is depleted.

7. The photodiode of claim 1, wherein said first waveguide cladding layer comprises a metallic material, dielectric material, semiconductor material or confined air space.

8. The photodiode of claim 1, wherein said second waveguide cladding layer comprises a metallic material, dielectric material, semiconductor material or confined air space.

9. The photodiode of claim 1, wherein said first electroconductive contact layer comprises an n-type electroconductive contact layer and wherein said second electroconductive contact layer comprises a p-type electroconductive contact layer.

10. The photodiode of claim 1, wherein said first electroconductive contact layer comprises a p-type electroconductive contact layer and wherein said second electroconductive contact layer comprises an n-type electroconductive contact layer.

11. The photodiode of claim 1, further comprising a substrate layer having a first side and an opposing second side, wherein the first side of said first electroconductive contact layer is located on the second side of said substrate layer.

12. A monolithic waveguide-integrated photodiode comprising:
at least one first electroconductive contact layer having a first side and an opposing second side, wherein said first electroconductive contact layer has a first refractive index;

a waveguide core layer comprising a layer from a semiconducting material having a first side and an opposing second side, the first side of said waveguide core layer being arranged on the second side of said first electroconductive contact layer, wherein said waveguide core layer has a second refractive index;

an absorption layer having a first side and an opposing second side, wherein the first side of said absorption layer is arranged on the second side of said waveguide core layer and said absorption layer has a third refractive index;

at least one second electroconductive contact layer having a first side and an opposing second side, wherein the first side of said second electroconductive contact layer is arranged on the second side of said absorption layer, wherein said second electroconductive contact layer has a fourth refractive index;

wherein the first refractive index of said first electroconductive contact layer is lower than the second refractive index of said waveguide core layer;

wherein the second refractive index of said waveguide core layer is lower than the third refractive index of said absorption layer; and wherein the fourth refractive index of said second electroconductive contact layer is lower than the third refractive index of said absorption layer.

13. The photodiode of claim 12, wherein said first electroconductive contact layer is configured to act as a first waveguide cladding layer.

14. The photodiode of claim 13, further comprising a second waveguide cladding layer having a first side and an opposing second side, wherein the first side of said second waveguide cladding layer is located on the second side of said absorption layer and wherein the second side of said second waveguide cladding layer is located on the first side of said second electroconductive contact layer.

15. The photodiode of claim 14, wherein said second waveguide cladding layer has a fifth refractive index, wherein the fourth refractive index of said second electroconductive contact layer is less than or equal to the fifth refractive index of said second waveguide cladding layer.

16. The photodiode of claim 14, wherein said second waveguide cladding layer has a fifth refractive index, wherein the fourth refractive index of said second electroconductive contact layer is greater than the fifth refractive index of said second waveguide cladding layer.

17. The photodiode of claim 15, wherein the fifth refractive index of said second waveguide cladding layer is lower than the third refractive index of said absorption layer.

18. The photodiode of claim 12, wherein said second electroconductive contact layer is configured to act as a second waveguide cladding layer.

19. The photodiode of claim 18, further comprising a first waveguide cladding layer having a first side and an opposing second side, wherein the first side of said first waveguide cladding layer is located on the second side of said first electroconductive contact layer and wherein the second side of said first waveguide cladding layer is located on the first side of said waveguide core layer.

20. The photodiode of claim 19, wherein said first waveguide cladding layer has a sixth refractive index, wherein the first refractive index of said first electroconductive contact layer is less than or equal to the sixth refractive index of said first waveguide cladding layer.

21. The photodiode of claim 20, wherein the sixth refractive index of said first waveguide cladding layer is lower than the second refractive index of said waveguide core layer.

22. The photodiode of claim 12, wherein the first electroconductive contact layer is configured to act as a first waveguide cladding layer and the second electroconductive contact layer is configured to act as a second waveguide cladding layer.

23. The photodiode of claim 12, wherein said waveguide core layer is not intentionally doped.

24. The photodiode of claim 12, wherein said waveguide core layer is lightly doped.

25. The photodiode of claim 12, wherein said waveguide core layer is depleted.

26. The photodiode of claim 14, wherein said second waveguide cladding layer comprises a metallic material, dielectric material, semiconductor material or confined air space.

27. The photodiode of claim 19, wherein said first waveguide cladding layer comprises a metallic material, dielectric material, semiconductor material, or confined air space.

28. The photodiode of claim 12, wherein said first electroconductive contact layer comprises an n-type electroconductive contact layer and wherein said second electroconductive contact layer comprises a p-type electroconductive contact layer.

29. The photodiode of claim 12, wherein said first electroconductive contact layer comprises a p-type electroconductive contact layer and wherein said second electroconductive contact layer comprises an n-type electroconductive contact layer.

30. The photodiode of claim 12, further comprising a substrate layer having a first side and an opposing second side, wherein the first side of said first electroconductive contact layer is located on the second side of said substrate layer.

31. A monolithic waveguide-integrated photodiode comprising:

at least one first electroconductive contact layer having a first side and an opposing second side;
a first waveguide cladding layer having a first side and an opposing second side, wherein the first side of the first waveguide cladding layer is arranged on the second side of said first electroconductive contact layer, wherein said first electroconductive contact layer has a first refractive index and said first waveguide cladding layer has a second refractive index;
a waveguide core layer comprising a layer from a semiconducting material having a first side and an opposing second side, the first side of said waveguide core layer being arranged on the second side of said first waveguide cladding layer, wherein said waveguide core layer has a third refractive index;
an absorption layer having a first side and an opposing second side, wherein the first side of said absorption layer is arranged on the second side of said waveguide core layer and said absorption layer has a fourth refractive index;
a second waveguide cladding layer having a first side and an opposing second side, wherein the first side of said second waveguide cladding layer is arranged on the second side of said absorption layer; and
at least one second electroconductive contact layer having a first side and an opposing second side, wherein the first side of said second electroconductive contact layer is arranged on the second side of said second waveguide cladding layer, wherein said second waveguide cladding layer has a fifth refractive index and said second electroconductive contact layer has a sixth refractive index.

32. A monolithic waveguide-integrated photodiode comprising:
at least one first electroconductive contact layer having a first side and an opposing second side, wherein said first electroconductive contact layer has a first refractive index;
a waveguide core layer comprising a layer from a semiconducting material having a first side and an opposing second side, the first side of said waveguide core layer being arranged on the second side of said first electroconductive contact layer, wherein said waveguide core layer has a second refractive index;
an absorption layer having a first side and an opposing second side, wherein the first side of said absorption layer is arranged on the second side of said waveguide core layer and said absorption layer has a third refractive index; and
at least one second electroconductive contact layer having a first side and an opposing second side, wherein the first side of said second electroconductive contact layer is arranged on the second side of said absorption layer, wherein said second electroconductive contact layer has a fourth refractive index.

* * * * *